United States Patent
LaMeres et al.

(10) Patent No.: US 7,492,173 B2
(45) Date of Patent: Feb. 17, 2009

(54) PROBE ACCESSORIES, AND METHODS FOR PROBING TEST POINTS USING SAME

(75) Inventors: Brock J. LaMeres, Colorado Springs, CO (US); Brent A. Holcombe, Colorado Springs, CO (US); Kenneth Johnson, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 205 days.

(21) Appl. No.: 11/331,664

(22) Filed: Jan. 12, 2006

(65) Prior Publication Data
US 2007/0159191 A1    Jul. 12, 2007

(51) Int. Cl.
*G01R 31/02* (2006.01)
(52) U.S. Cl. ...................................... 324/754
(58) Field of Classification Search ................. 324/754, 324/761–762, 760, 765, 158.1; 439/650, 439/638, 67, 357
See application file for complete search history.

(56) References Cited

U.S. PATENT DOCUMENTS

| | | | |
|---|---|---|---|
| 4,883,443 A | 11/1989 | Chase | |
| 5,223,787 A | 6/1993 | Smith et al. | |
| 6,359,452 B1 | 3/2002 | Mozzetta | |
| 6,462,570 B1 | 10/2002 | Price et al. | |
| 6,469,530 B1 | 10/2002 | Johnson et al. | |
| 6,512,389 B1 | 1/2003 | Kocher | |
| 6,541,991 B1 | 4/2003 | Hornchek et al. | |
| 6,570,399 B2 | 5/2003 | Yeghiayan et al. | |
| 6,575,772 B1 | 6/2003 | Soubh et al. | |
| 6,624,647 B2 | 9/2003 | Adams et al. | |
| 6,667,628 B2 | 12/2003 | Ahrikencheikh et al. | |
| 6,756,797 B2 | 6/2004 | Brandorff et al. | |
| 6,762,612 B2 * | 7/2004 | Yu et al. | ...................... 324/757 |
| 6,798,225 B2 | 9/2004 | Miller | |
| 6,822,466 B1 | 11/2004 | Holcombe et al. | |
| 6,867,609 B2 | 3/2005 | Holcombe et al. | |
| 7,098,680 B2 * | 8/2006 | Fukushima et al. | ......... 324/763 |
| 2005/0179454 A1 | 8/2005 | LaMeres et al. | |

OTHER PUBLICATIONS

LaMeres; "Differential Logic Analyzer Probing"; analogZONE; Jul. 5, 2004; 5 pp.

(Continued)

*Primary Examiner*—Ha Tran T Nguyen
*Assistant Examiner*—Tung X Nguyen

(57) ABSTRACT

Probe accessories, and methods for routing signals between a target and a test instrument using the probe accessories, are disclosed. Some of the probe accessories include a flexible circuit and first and second pairs of contacts. Flexible circuit design varies, but one embodiment has first and second regions, a first conductor and a second conductor, and a separation feature. The first conductor extends into the first region while the second conductor extends into both the first and second regions and has a fixed spacing with respect to the first conductor. A separation feature extends between first and second regions and is operable to create two independently maneuverable legs, each leg comprising an end portion of the first and second regions, while maintaining a fixed spacing between the first and second conductors. The first and second pairs of contacts electrically couple the probe accessories between test points and test instruments.

19 Claims, 8 Drawing Sheets

OTHER PUBLICATIONS

McTigue; "Single-Ended or Differential? That is the Questions"; EDN; Feb. 6, 2003; www.edn.com; pp. 77, 78, 80, 82.

www.agilent.com, "Soft Touch Connectorless Logic Analyzer Probe"; Agilent Models E5387A, E5390A, and E5394A, Jun, 5, 2003, 2 pp.

U.S. Appl. No. 10/918,285, filed Aug. 13, 2004 Entitled "Incorporation of Isolation Resistor(s) Into Probes Using Probe Tip Spring Pins"; LaMeres, et al.; 22 pp.

U.S. Appl. No. 10/902,405, filed Jul. 28, 2004 Entitled "Backside Attach Probe, Components Thereof, and Methods for Making and Using Same"; LaMeres, et al.; 24 pp.

\* cited by examiner

PROBE ACCESSORIES, AND METHODS FOR PROBING TEST POINTS USING SAME

BACKGROUND

Probing a target, such as a printed circuit board (PCB), may be done in a number of different ways. One way to probe a PCB involves using a hand-forced connection (i.e., where a user manually presses a probe against the point or points to be probed). Another way to probe a PCB is via a solder-down connection. Sometimes, the probes themselves cannot make contact with a PCB due to mechanical interference (i.e. obstructions on the PCB, or close spacing of test points). In these situations, a smaller and more flexible probe may be able to make mechanical contact with the PCB, where a larger or rigid probe could not.

When a smaller more flexible probe is required, a common practice involves using two flexible wires to make contact with a PCB. Typically, one wire will be used for the signal path and one wire will be used for ground. However, using flexible wires to contact the PCB may result in a decrease in signal integrity as signal frequencies rise. For example, the loading on the target signal may become destructive, and the wire may distort the signal that a test instrument observes.

SUMMARY OF THE INVENTION

In a first embodiment, a probe accessory for electrically coupling a target to a test instrument comprises a flexible circuit, and first and second pairs of contacts. The flexible circuit has first and second regions, and first and second conductors. The first and second regions each have an end portion that terminates at a common edge of the flexible circuit. The first conductor extends into the end portion of the first region. The second conductor extends into the end portions of the first and second regions and has a fixed spacing with respect to the first conductor. Ones of the first pair of contacts are respectively coupled to the first and second conductors and provide a means to electrically couple the first and second conductors to the test instrument. Ones of the second pair of contacts are respectively coupled to the first and second conductors in the end portions of the first and second regions. The second pair of contacts provides a means to electrically couple the first and second conductors to the target.

In a second embodiment, a probe accessory for electrically coupling a target to a test instrument comprises a flexible circuit, and first and second pairs of contacts. The flexible circuit has first and second independently maneuverable legs, and first and second conductors. The first and second independently maneuverable legs each terminate in an end portion. The first conductor extends into the end portion of the first independently maneuverable leg. The second conductor extends into the end portions of both the first and second independently maneuverable legs and has a fixed spacing with respect to the first conductor. Ones of the first pair of contacts are respectively coupled to the first and second conductors and provide a means to electrically couple the first and second conductors to the test instrument. Ones of the second pair of contacts are respectively coupled to the first and second conductors in the end portions of the first and second independently maneuverable legs. The second pair of contacts provides a means to electrically couple the first and second conductors to the target.

In a third embodiment, a probe accessory for electrically coupling a target to a test instrument comprises a flexible circuit and a plurality of contacts. The flexible circuit has first and second regions, and first, second and third conductors. The first and second regions each have an end portion that terminates at a common edge of the flexible circuit. The first conductor extends into the end portion of the first region. The second conductor extends into the end portion of the second region. The third conductor extends into the end portions of the first and second regions and has a fixed spacing with respect to the first and second conductors. Ones of a set of contacts are respectively coupled to the first, second and third conductors and provide a means to electrically couple the first, second and third conductors to the test instrument. Ones of a pair of contacts are respectively coupled to the first and second conductors in the end portions of the first and second regions and provide a means to electrically couple the first and second conductors to the target.

In a fourth embodiment, a probe accessory for electrically coupling a target to a test instrument comprises a flexible circuit and a plurality of contacts. The flexible circuit has first and second independently maneuverable legs, and first, second and third conductors. The first and second independently maneuverable legs each terminate in an end portion. The first conductor extends into the end portion of the first independently maneuverable leg. The second conductor extends into the end portion of the second independently maneuverable leg. The third conductor extends into the end portions of both the first and second independently maneuverable legs and has a fixed spacing with respect to the first and second conductors. Ones of a first set of contacts are respectively coupled to the first, second and third conductors and provide a means to electrically couple the first, second and third conductors to the test instrument. Ones of a second pair of contacts are respectively coupled to the first and second conductors in the end portions of the first and second independently maneuverable legs and provide a means to electrically couple the first and second conductors to the target.

In a fifth embodiment, a method is provided for routing signals between test points on a target and a test instrument. The method comprises selecting a probe accessory comprising a flexible circuit having two independently maneuverable legs, a first conductor extending into an end portion of the first independently maneuverable leg, and a second conductor extending into end portions of both the first and second independently maneuverable legs and having a fixed spacing with respect to the first conductor. Ones of a first pair of contacts, which are respectively coupled to the first and second conductors, are then electrically coupled to a test instrument; and the two independently maneuverable legs are bent to electrically couple a second pair of contacts, ones of which are respectively coupled to the first and second conductors in the end portions of the first and second independently maneuverable legs, to the test points on the target. Signals are then routed between the test points on the target and the test instrument via the probe accessory.

In a sixth embodiment, another method is provided for routing signals between test points on a target and a test instrument. The method comprises selecting a probe accessory comprising a flexible circuit having two independently maneuverable legs, a first conductor extending into an end portion of the first independently maneuverable leg, a second conductor extending into an end portion of the second independently maneuverable leg, and a third conductor extending into the end portions of both the first and second independently maneuverable legs and having a fixed spacing with respect to both the first and second conductors. Ones of a first pair of contacts, which are respectively coupled to the first and second conductors, are then electrically coupled to a test instrument; and the two independently maneuverable legs are bent to electrically contact a second pair of contacts, ones of which are respectively coupled to the first and second conductors in the end portions of the first and second independently maneuverable legs, to the test points on the target. Signals are then routed between the test points on the target and the test instrument via the probe accessory.

BRIEF DESCRIPTION OF THE DRAWINGS

Illustrative and presently preferred embodiments of the invention are illustrated in the drawings, in which.

DESCRIPTION OF THE INVENTION

Figure 1:
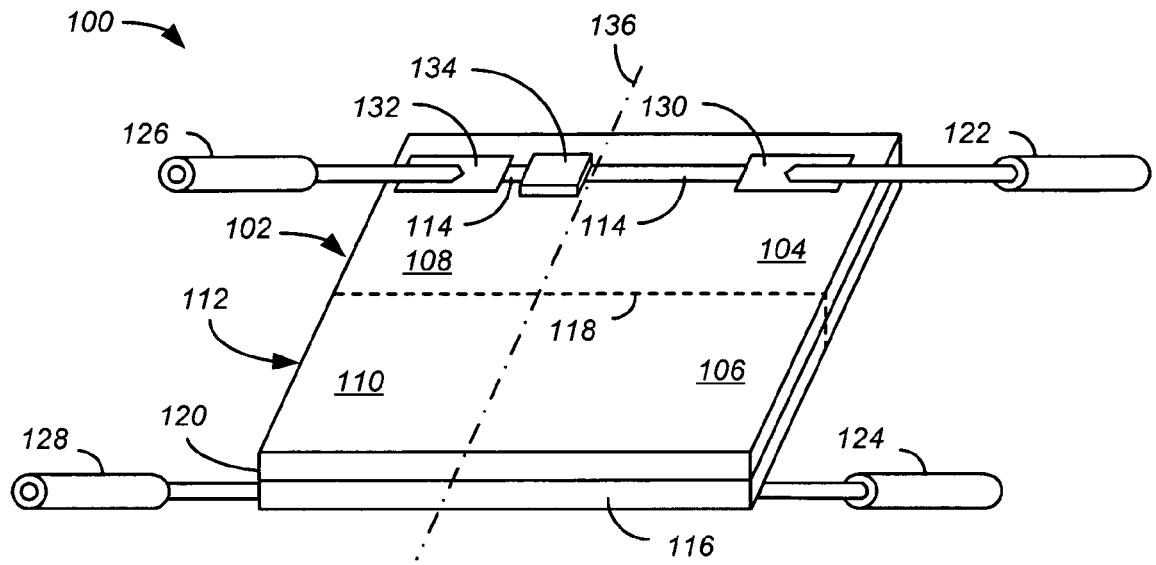
FIG. 1 illustrates a perspective view of a first exemplary embodiment of a probe accessory.

As a preliminary manner, it is noted that, in the following description, like reference numbers appearing in different drawing figures refer to like elements/features. Often, therefore, like elements/features that appear in different drawing figures will not be described in detail with respect to each of the drawing figures.

Figure 9:
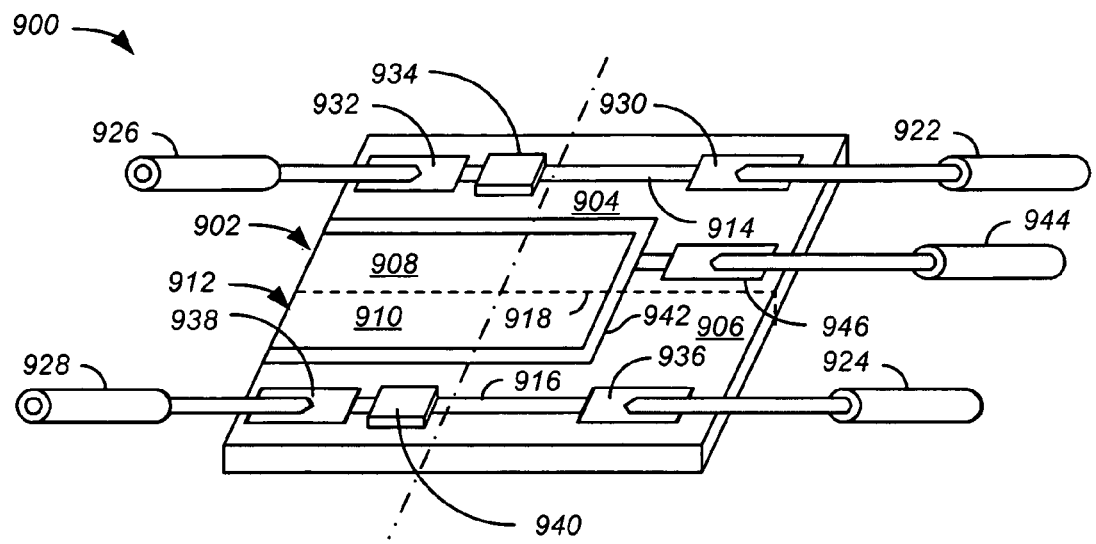
FIG. 9 illustrates a perspective view of a first exemplary embodiment of a differential probe accessory.
Figure 10:
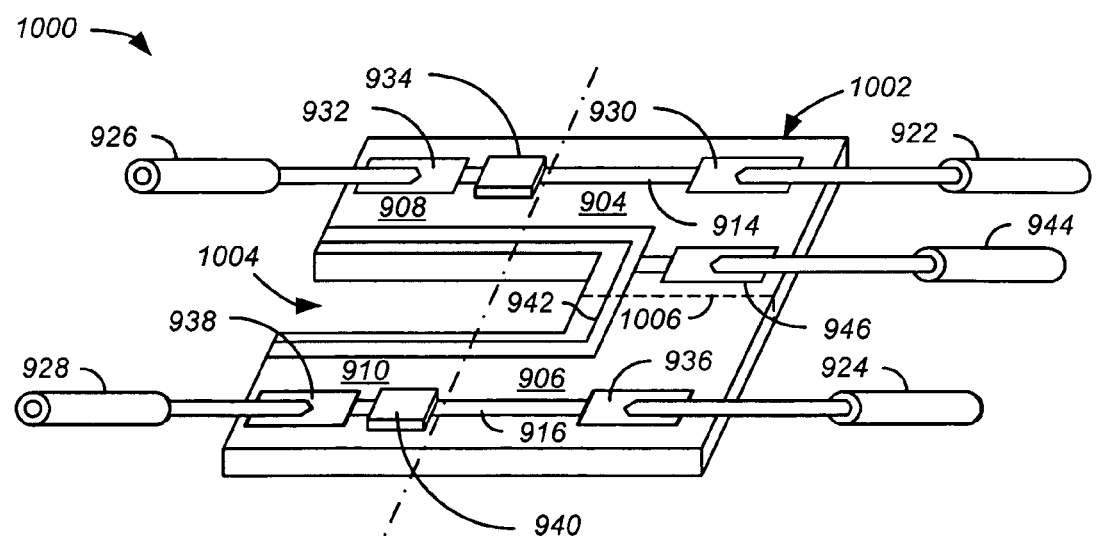
FIG. 10 illustrates a perspective view of a second exemplary embodiment of a differential probe accessory.
Figure 11:
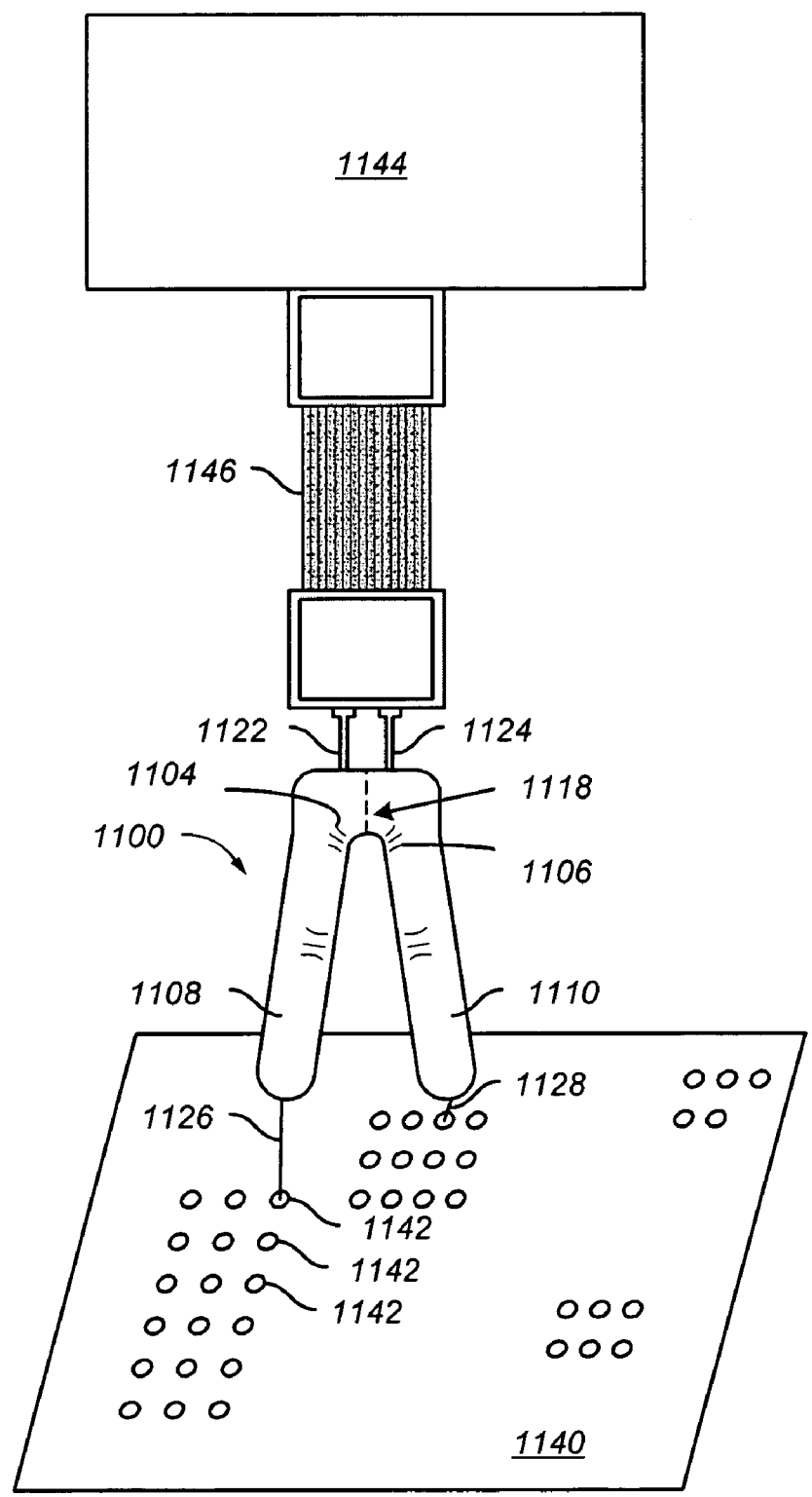
FIG. 11 illustrates an exemplary system in which the probe accessories shown in FIGS. 5, 6, & 10 may be implemented.

FIGS. 1-11 illustrate exemplary embodiments of probe accessories for electrically coupling a target 1140 to a test instrument 1144 (FIG. 11). The target 1140 may take various forms, including those of a circuit component or printed circuit board (PCB). The test instrument 1144 may also take various forms, including those of a logic analyzer or oscilloscope. As shown in FIG. 11, the probe accessories (such as accessory 1100) may be coupled to the test instrument 1144 via test leads and/or cables (such as cable 1146).

Each of the probe accessories shown in FIGS. 1-11 comprises a flexible circuit and at least first and second pairs of contacts. The first and second pairs of contacts are electrically coupled by means of conductors of the flexible circuit. The first and second pairs of contacts may comprise various types of contacts, such as pins or receptacles. In addition to routing test signals, the flexible circuit 1) provides a means for reconfiguring the shape of the probe accessory, thereby enabling it to reach a greater number of configurations of test points, and 2) provides a means for keeping a fixed spacing between the conductors of the flexible circuit, thereby regulating their impedances.

As will be described in greater detail below, a flexible circuit may assume a variety of shapes, including generally rectangular shapes and pants-like shapes. In the latter, a flexible circuit may comprise a plurality of independently maneuverable legs through which different conductors are routed. In addition to being able to provide the advantages mentioned in the preceding paragraph, flexible circuits that have independently maneuverable legs (see, FIGS. 5, 6, 7, 10 & 11) provide an ability to reach test points having different spacings.

A flexible circuit may also be provided with a separation feature. See, for example, the separation features 118, 518, 718, 918, 1018 and 1118 shown in FIGS. 1, 3-7 & 9-11. By way of example, a separation feature may comprise a cut-line, notch, perforation or detent that aids in creating, or increasing the length of, independently maneuverable legs of the flexible circuit (thereby enabling a probe accessory to reach test points with different spacings).

Some of the probe accessories disclosed herein are configured for single-ended probing and provide a means for connecting signal and ground conductors between a target and a test instrument. See, for example, the probe accessories shown in FIGS. 1, 3, 4, 5, 6 & 7. Other ones of the probe accessories are configured for differential probing and provide a means of connecting a pair of signal conductors between a target and a test instrument. See, for example, the probe accessories shown in FIGS. 9 & 10.

Having generally described some of the features of the probe accessories disclosed herein, various embodiments of the probe accessories will now be described in greater detail.

A first embodiment of a probe accessory 100 is shown in FIG. 1. The probe accessory 100 comprises a flexible circuit 102 to which first and second pairs of contacts 122/124, 126/128 are coupled.

As shown, the flexible circuit 102 may comprise first and second regions 104, 106, each of which has an end portion 108, 110 (to the left of line 136) that terminates at a common edge 112 of the flexible circuit 102. Optionally, the dividing line between the first and second regions 104, 106 may be defined by a separation feature 118 that can be employed to partially or wholly separate the first and second regions 104, 106 (e.g., by cutting or tearing the separation feature 118).

Although the first and second regions 104, 106 are shown in FIG. 1 as being generally rectangular, they may alternately take other shapes. Alternately, the flexible circuit 102 may be divided into more than two regions 104, 106.

As shown in FIG. 1, a first conductor 114 extends into the end portion 108 of the region 104. Preferably, the entirety of conductor 114 is contained within the region 104. As will be described in more detail later in this description, the conductor 114 extends between contacts 122 and 126 of the first and second pairs of contacts 122/124, 126/128.

A second conductor 116 extends into both 1) the end portion 108 of region 104, and 2) the end portion 110 of region 106. In the probe accessory 100, this is achieved by means of conductor 116 taking the form of a flexible plane that covers all (or substantially all) of the underside of a flexible substrate 120. Of note, the inclusion of conductors 114 and 116 in the same flexible circuit 102 enables the conductors 114, 116 to have a fixed spacing with respect to one another. This differs from probe accessories having independently maneuverable wire conductors, wherein the spacing between the wires can change depending on how the wires are manipulated. As will be described in more detail later in this description, the conductor 116 extends between contacts 124 and 128 of the first and second pairs of contacts 122/124, 126/128.

Figure 2:
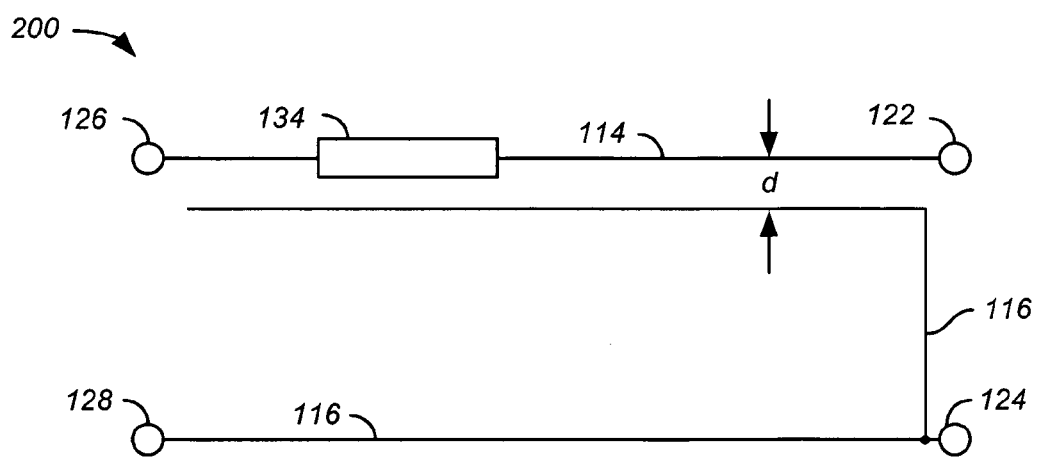
FIG. 2 illustrates an electrical schematic for the probe accessory shown in FIG. 1.

FIG. 2 provides an electrical schematic 200 that illustrates the relationship between the first and second conductors 114, 116 shown in FIG. 1. The fixed spacing between the first and second conductors 114, 116 is designated "d", and represents the thickness of the flexible substrate 120. If the conductor 116 is a ground plane, then a relatively small spacing "d" enables the conductor 116 to act as an electrical shield for the conductor 114, thereby reducing coupling effects between the conductor 114 and other signal conductors, and also regulating the impedance of the conductor 114.

Turning back to FIG. 1, the conductors 114, 116 may be formed or deposited on the flexible substrate 120 in various ways, in accord with known and/or yet to be developed flexible circuit construction techniques. By way of example, the flexible substrate 120 may comprise any suitable dielectric material, such as plastic; and the conductors 114, 116 may comprise any suitable conductive material, such as copper, gold or aluminum.

The first and second pairs of contacts 122/124, 126/128 may be coupled to the conductors 114, 116 in a variety of ways. For example, in some cases, the contacts 122, 124, 126, 128 may be soldered directly to the conductors 114, 116. In other cases, solder pads (such as pads 130, 132) may be applied to the ends of the conductors 114, 116, and the contacts (e.g., contacts 122, 126) may be soldered to the solder pads (e.g., pads 130, 132). Other means of attaching the contacts 122, 124, 126, 128 to the conductors 114, 116 may also be employed.

As previously mentioned, the contacts 122, 124, 126, 128 may take various forms. In FIG. 1, all of the contacts 122, 124, 126, 128 are shown to be receptacles. The receptacles are capable of receiving pins on a target, or pins of a test instrument cable. Alternately, one or both pairs of contacts 122/124, 126/128 could take the form of pins or connectors.

A damping resistor 134 may be coupled in series with the first conductor 114, in the end portion 108 of the region 104. The damping resistor 134 may compensate for inductance and capacitance mismatches between a target and a test instrument to which the probe accessory 100 is coupled. By way of example, the resistor 134 may be embedded within the flexible circuit 102 or conductor 114, or may be a discrete component that is attached to portions of the conductor 114.

As previously mentioned, the flexible circuit 102 may comprise a separation feature 118. The separation feature 118 extends from the edge 112 so as to partly or wholly define the boundary between the regions 104 and 106. In FIG. 1, the separation feature 118 is shown to wholly define the boundary between the regions 104 and 106.

The purpose of the separation feature 118 is to aid in dividing the regions 104 and 106 to create two independently maneuverable legs of the flexible circuit 102. By way of example, the separation feature 118 could take the form of a cut-line (e.g., a printed line indicating where to cut the flexible circuit 102), one or more perforations in the flexible circuit 102, a notch, or a detent (e.g., a portion of the flexible substrate 120 that has been thinned to allow for easier cutting or tearing of the flexible circuit 102). Depending on the nature of the separation feature 118, the separation feature may be operated by tearing or cutting the separation feature 118.

The separation feature 118 will typically be operable to create independently maneuverable legs of a desired length. Thus, a user can divide the regions 104, 106 only as much as is necessary to reach a pair of test points to which the user would like to couple the probe accessory 100. Since, the conductor 116 covers the entirety of the flexible substrate 120 (see FIG. 1), the regions 104 and 106 can be divided almost to the point of separation, while still maintaining the fixed spacing between the conductors 114 and 116. However, if the separation feature 118 is used to completely separate the first and second regions 104, 106, thereby creating two separate probe accessories, then any portion of the second conductor 116 that extends into the region 104 becomes "electrically unattached", and each of the separate probe accessories functions similarly to an unshielded wire.

Figure 3:
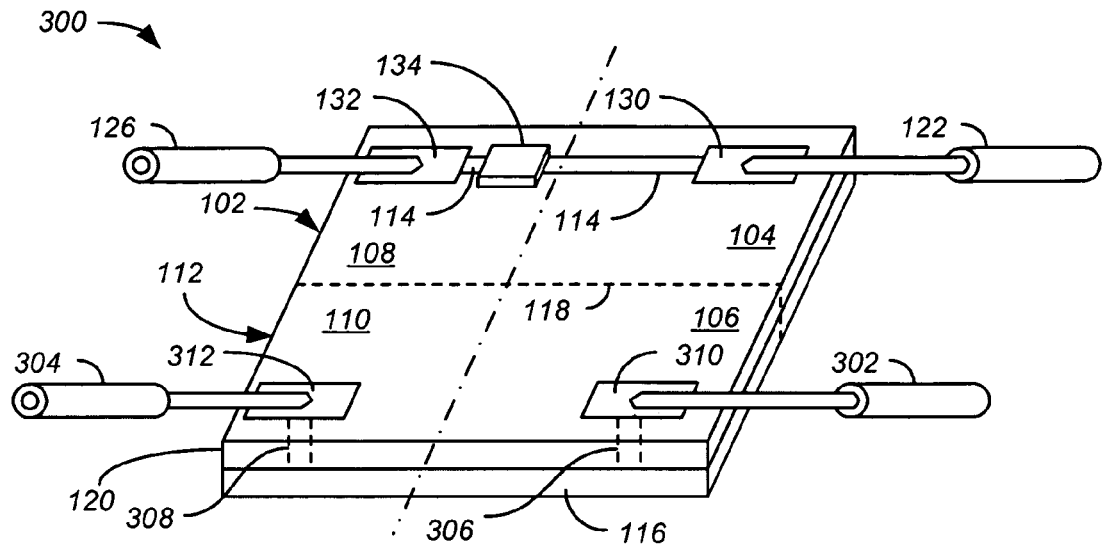
FIG. 3 illustrates a perspective view of a second exemplary embodiment of a probe accessory.

FIG. 3 illustrates an alternate embodiment 300 of the probe accessory shown in FIG. 1. Note that like reference numbers have been used to identify similar structures in the probe accessories 100 and 300.

In the probe accessory 300 (FIG. 3), the second conductor 116 is electrically coupled to the contacts 302, 304 through vias 306, 308 and solder pads 310, 312. In some cases, the accessory 300 may be easier to manufacture than the accessory 100, given that all of the contacts 122, 124, 302, 304 of the accessory 300 are coupled to the same side of the flexible circuit 102.

Figure 4:
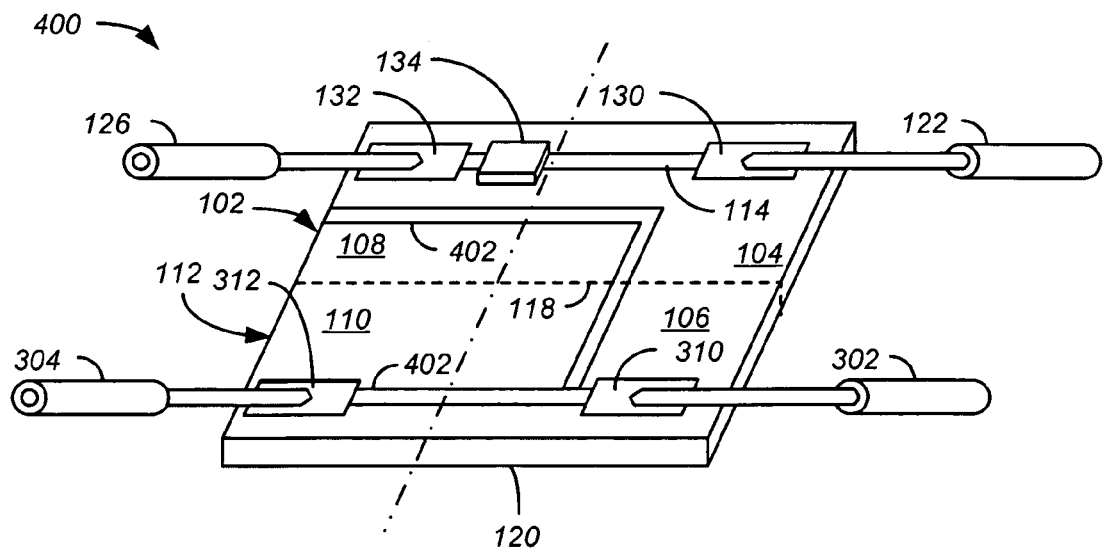
FIG. 4 illustrates a perspective view of a third exemplary embodiment of a probe accessory.

The flexible circuit 102 (FIGS. 1 & 3) comprises three layers (i.e., a layer in which the conductor 114 is formed, a flexible substrate layer 120, and a layer in which the conductor 116 is formed). By forming the conductors 114, 116 on layers that are separated by the flexible substrate 120, the flexible substrate 120 may be relied on to provide the fixed spacing "d" between the conductors 114, 116 (see FIG. 2). However, in some cases, and possibly to reduce manufacturing steps, it may be desirable to form a pair of conductors 114, 402 in a single layer of a flexible circuit, as shown in FIG. 4 (where conductor 402 replaces the conductor 116 shown in FIG. 3). In the probe accessory 400, one leg of the conductor 402 extends into the end portion 110 of region 106, and another leg of the conductor 402 extends into the end portion 108 of region 104. If the separation feature 118 is employed, it may be cut or torn up to the point where it intersects the conductor 402, while still maintaining the fixed spacing "d" between the conductors 114 and 402.

Figure 5:
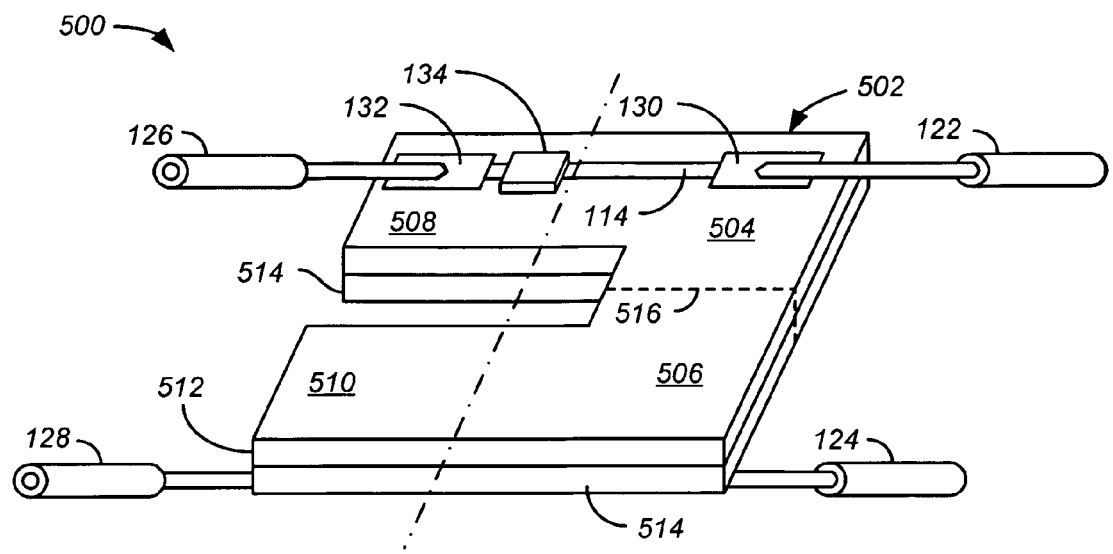
FIG. 5 illustrates a perspective view of a first exemplary embodiment of a probe accessory having two independently maneuverable legs.

FIG. 5 illustrates yet another alternate embodiment 500 of the probe accessory shown in FIG. 1. The probe accessory 500 (FIG. 5) comprises conductors 114, 514 that are formed on opposite sides of a flexible circuit 502, similarly to the conductors 114 and 116 of the probe accessory 100 (FIG. 1). The probe accessory 500 also comprises contacts 122, 124, 126, 128 that are attached to the conductors 115, 514 as previously described with respect to FIG. 1. However, in contrast to the flexible circuit 102, the flexible circuit 502 has a pants-like shape that provides it with two independently maneuverable legs 504, 506. The conductor 114 extends into an end portion 508 of the leg 504, and electrically couples contacts 122 and 126. The conductor 514 extends into both 1) the end portion 508 of the leg 504, and 2) an end portion 510 of the leg 506 (e.g., by means of conductor 514 taking the form of a flexible plane that covers all (or substantially all) of the underside of the flexible substrate 512). The conductor 514 electrically couples contacts 124 and 128.

The independently maneuverable legs 504, 506 of the probe accessory 500 may assume any length or width. However, the length of the legs (i.e., the distance between the tester contacts 122, 124 and the target contacts 126, 128) will typically be much greater than the width of the legs 504, 506, thereby providing the contacts 126 and 128 with greater maneuverability with respect to one another.

In addition to the independently maneuverable legs 504, 506, the probe accessory 500 may further comprise a separation feature 518 that may be used to further separate the legs 504, 506 from one another, and thereby provide the contacts 126 and 128 with even greater maneuverability with respect to one another.

Figure 6:
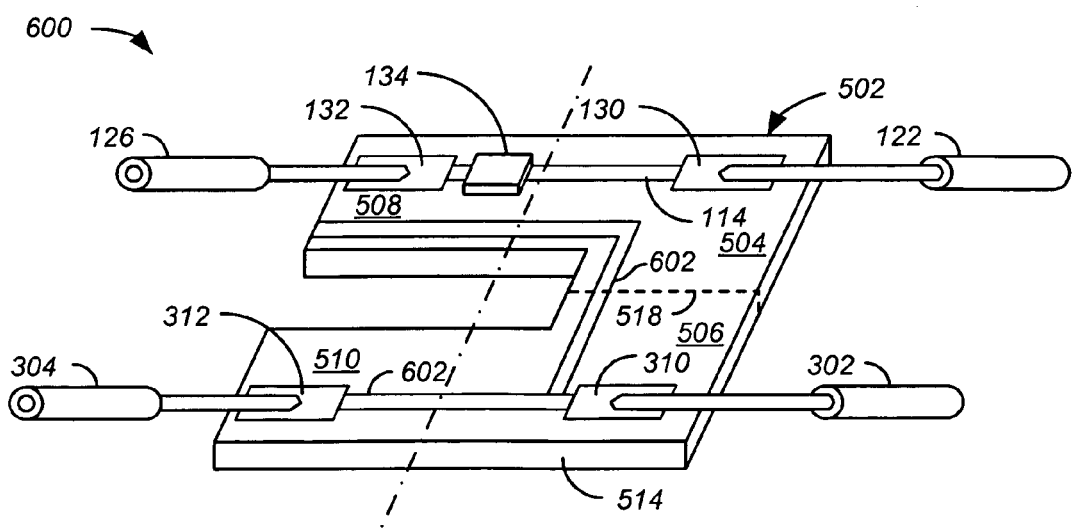
FIG. 6 illustrates a perspective view of a second exemplary embodiment of a probe accessory having two independently maneuverable legs.

The flexible circuit 502 (FIG. 5) comprises three layers (i.e., a layer in which the conductor 114 is formed, a flexible substrate layer 512, and a layer in which the conductor 514 is formed). By forming the conductors 114, 514 on layers that are separated by the flexible substrate 512, the flexible substrate 512 may be relied on to provide the fixed spacing "d" between the conductors 114, 514 (see FIG. 2). However, in some cases, and possibly to reduce manufacturing steps, it may be desirable to move the contacts 124, 128 to the same side of the flexible circuit 502 (similarly to what is shown in FIG. 3). In yet other cases, a pair of conductors 114, 602 may be formed in a single layer of the flexible circuit 502, as shown in FIG. 6 (where conductor 602 replaces the conductor 514 shown in FIG. 5). In the probe accessory 600, one leg of the conductor 602 extends into the end portion 510 of leg 506, and another leg of the conductor 602 extends into the end portion 508 of leg 504. If the separation feature 518 is employed, it may be cut or torn up to the point where it intersects the conductor 602, while still maintaining the fixed spacing "d" between the conductors 114 and 602.

Figure 7:
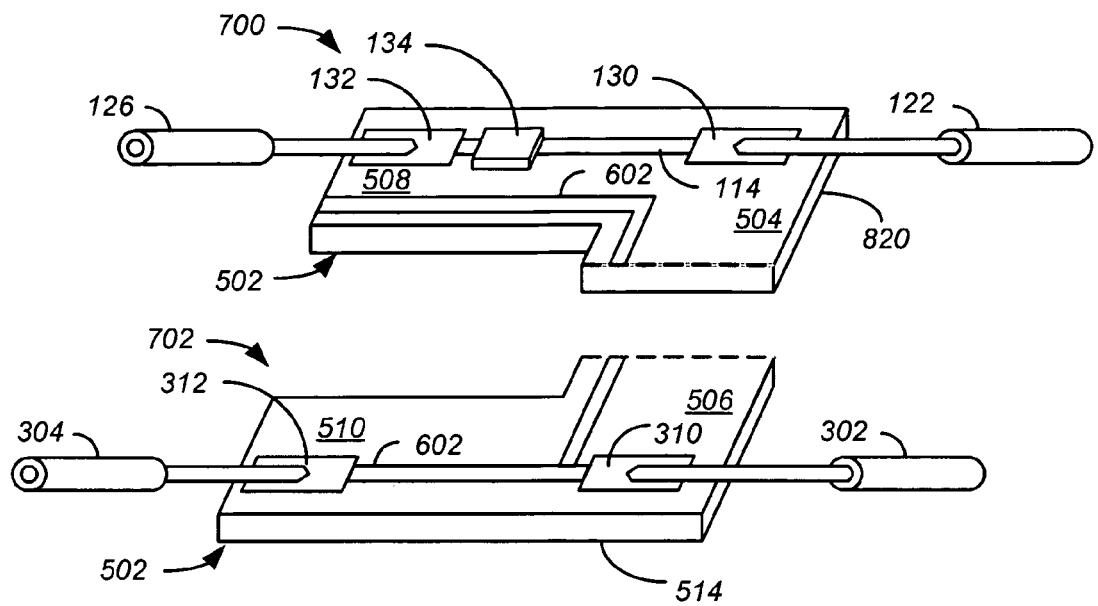
FIG. 7 illustrates a perspective view of a third exemplary embodiment of a probe accessory having two independently maneuverable legs.

FIG. 7 illustrates operation of the separation feature 518 to completely divide the probe accessory 600 into two separate unshielded probe accessories 700, 702.

Figure 8:
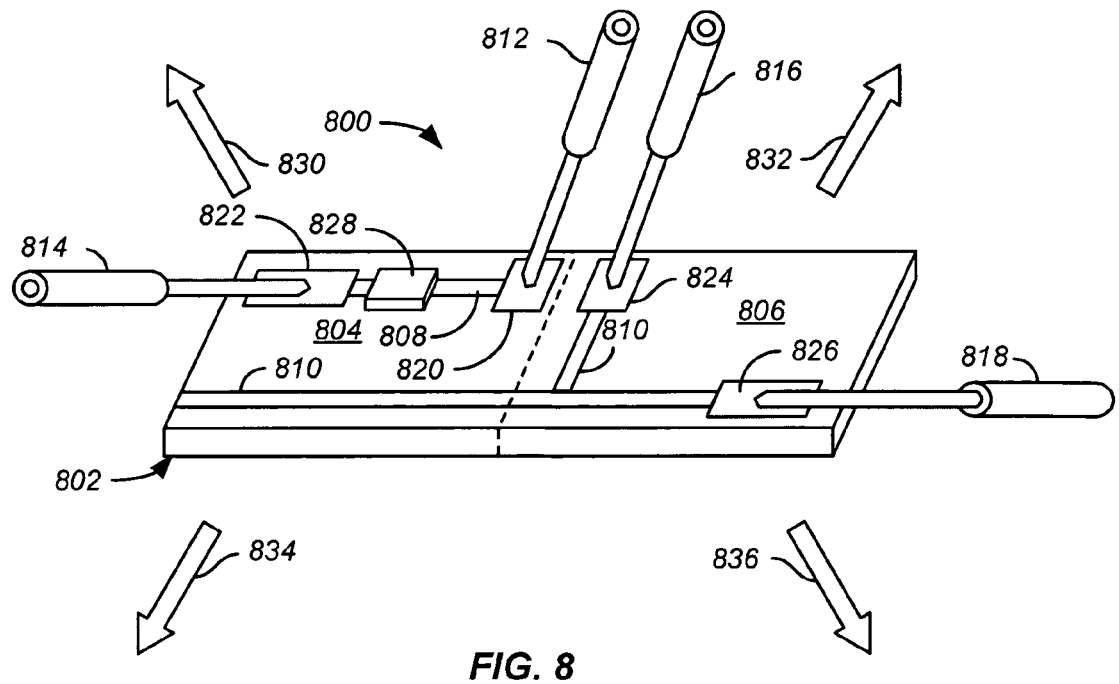
FIG. 8 illustrates a perspective view of the probe accessory shown in FIG. 6, after having been divided into two separate probe accessories via a separation feature.

FIG. 8 illustrates another embodiment 800 of a probe accessory. In contrast to the probe accessories 500, 600, which have independently maneuverable legs that extend in the same direction, the legs 804, 806 of the probe accessory 800 extend in opposite directions.

Similarly to other probe accessories that have been described in this description, the conductors of the probe accessory 800 may be formed on the same or different sides of a flexible circuit 802. By way of example, however, the conductors 808, 810 are shown to be formed on a single side of the flexible circuit 802. A first of the conductors 808 extends between a first pair of contacts 812, 814, and a second of the conductors 810 extends between a second pair of contacts 816, 818. The contacts 812, 816 may be positioned relatively close to one another, for easy connection to a test instrument, while the contacts 814, 818 may be positioned at opposite ends of the legs 804, 806, thereby providing maximum maneuverability of the contacts 814, 818 with respect to one another.

Each of the contacts 812, 814, 816, 818 may be soldered to a corresponding solder pad 820, 822, 824, 826 that is attached to a respective one of the conductors 808, 810.

As with previous probe accessory embodiments, a damping resistor 828 may be coupled in series with the conductor 808.

In use, the independently maneuverable legs 804, 806 of the probe accessory 800 may be bent in various directions, as indicated by arrows 820, 832, 834 and 836.

As previously mentioned, the probe accessories disclosed herein may be configured for single-ended or differential probing. The probe accessories 100, 300, 400, 500, 600, 800 described so far have been configured for single-ended probing, where one conductor carries signals and one conductor is coupled to ground.

FIG. 9 illustrates an embodiment of a probe accessory 900 that may be used for differential probing. The probe accessory 900 comprises a flexible circuit 902 to which first and second sets of contacts 922/924/944, 926/928 are coupled.

As shown, the flexible circuit 902 may comprise first and second regions 904, 906, each of which has an end portion 908, 910 that terminates at a common edge 912 of the flexible circuit 902. Optionally, the dividing line between the first and second regions 904, 906 may be defined by a separation feature 918 that can be employed to partially or wholly separate the first and second regions 904, 906 (e.g., by cutting or tearing the separation feature 918).

Although the first and second regions 904, 906 are shown in FIG. 9 as being generally rectangular, they may alternately take other shapes. Alternately, the flexible circuit 902 may be divided into more than two regions 904, 906.

As shown in FIG. 9, a first conductor 914 extends into the end portion 908 of the region 904. Preferably, the entirety of conductor 914 is contained within the region 904. The conductor 914 extends between contacts 922 and 926 of the first and second sets of contacts 922/924/944, 926/928.

A second conductor 916 extends into the end portion 910 of the region 906. Preferably, the entirety of conductor 916 is contained within the region 906. The conductor 916 extends between contacts 924 and 928 of the first and second sets of contacts 922/924/944, 926/928.

A third conductor 942 extends into both 1) the end portion 908 of region 904, and 2) the end portion 910 of region 906. In the probe accessory 900, this is achieved by means of conductor 942 branching into two legs, a respective one of which extends into the end portion 908 or the end portion 910. Alternately, the third conductor 942 could take the form of a plane covering much or all of the side of flexible circuit 902 that is opposite the conductors 914 and 916. The third conductor 942 could also take other forms. The conductor 942 extends between contact 944 and the end portions 908, 910 of the regions 904, 906.

The first and second sets of contacts 922/924/944, 926/928 may be coupled to the conductors 914, 916, 942 in a variety of ways. For example, in some cases, the contacts 922, 924, 926, 928, 944 may be soldered directly to the conductors 914, 916, 942. In other cases, solder pads (such as pads 930, 932, 936, 938, 946) may be applied to ends of the conductors 914, 916, 942, and the contacts (e.g., contacts 922, 924, 926, 928, 944) may be soldered to the solder pads (e.g., pads 930, 932, 936, 938, 946). Other means of attaching the contacts 922, 924, 926, 928, 944 to the conductors 914, 916, 942 may also be employed.

In use, the first and second conductors 914, 916 of the probe accessory 900 may be coupled to signals of a target, while the third conductor 942 may be connected to ground (i.e., typically the ground of a test instrument).

The inclusion of conductors 914, 916 and 942 in the same flexible circuit 902 enables the conductors 914, 916, 942 to have a fixed spacing with respect to one another, thereby enabling the conductor 942 to act as an electrical shield for the conductors 914 and 916 so as to reduce coupling effects between the conductors 914, 916 themselves, and between the conductors 914, 916 and other signal conductors. The conductor 942 also helps to regulate the impedance of the conductors 914, 916. This differs from probe accessories having independently maneuverable wire conductors, wherein the spacing between the wires can change depending on how the wires are manipulated.

Damping resistors 934, 940 may be coupled in series with each of the first and second conductors 914, 916, in the end portions 908, 910 of the regions 904, 906. The damping resistors 934, 940 may compensate for inductance and capacitance mismatches between a target and a test instrument to which the probe accessory 900 is coupled. By way of example, the resistors 934, 940 may be embedded within the flexible circuit 902 or conductors 914, 916, or may be discrete components that are attached to portions of the conductors 914, 916.

As previously mentioned, the flexible circuit 902 may also comprise a separation feature 918. The separation feature 918 extends from the edge 912 so as to partly or wholly define the boundary between the regions 904 and 906. In FIG. 9, the separation feature 918 is shown to wholly define the boundary between the regions 904 and 906.

FIG. 10 illustrates a variant 1000 of the probe accessory shown in FIG. 9, wherein a flexible circuit 1002 is provided with a notch 1004. The notch 1004 separates the end portions 908 and 910 of regions 904 and 906 so that each of the end portions 908 and 910 resides on an independently maneuverable leg of the flexible circuit 1002. In some cases, the probe accessory 1000 may still be provided with a separation feature 1006, which can be used in conjunction with the independently maneuverable legs to provide further maneuverability between the contacts 926 and 928.

Figure 12:
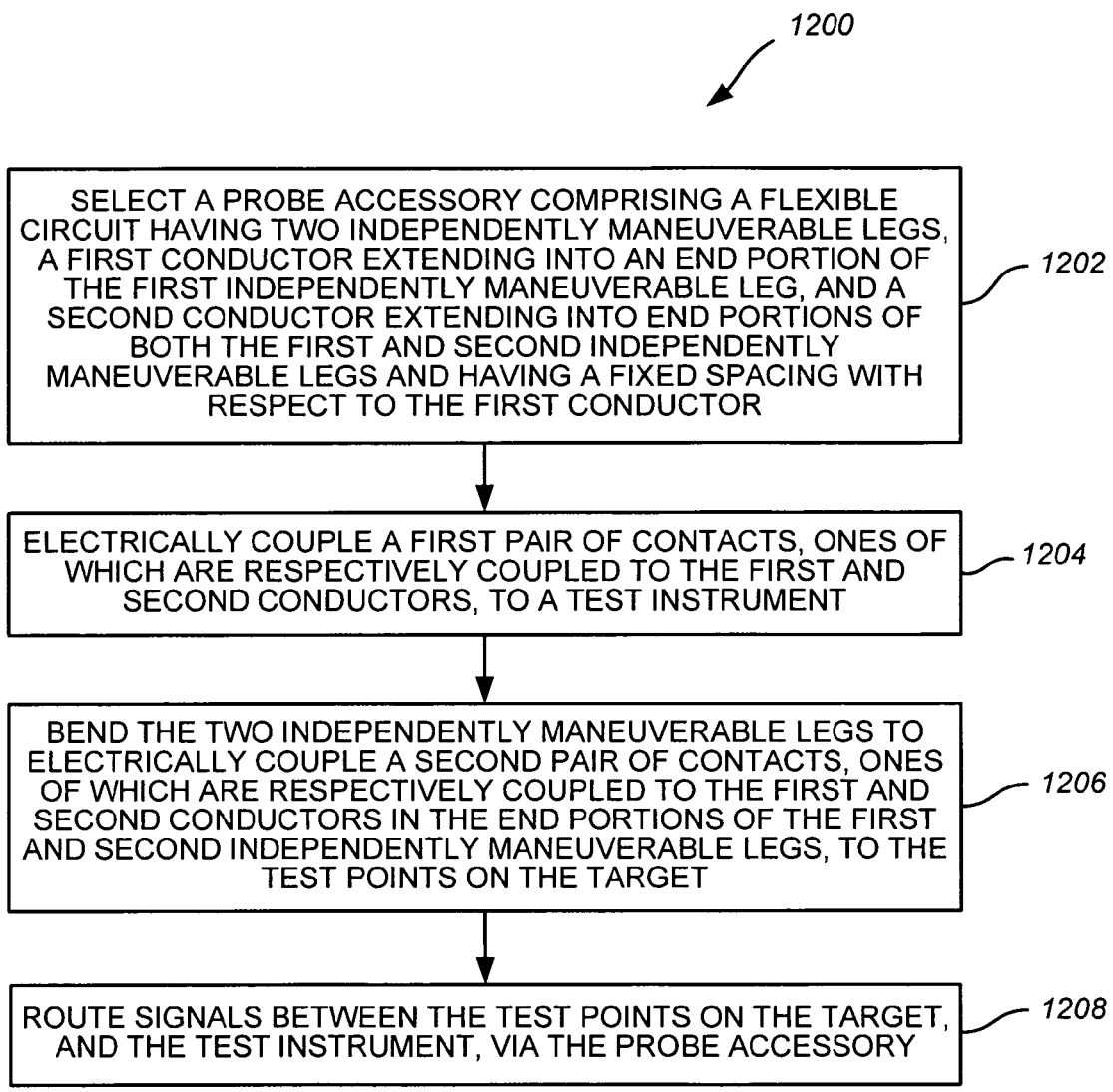
FIG. 12 illustrates an exemplary method for routing signals between test points on a target and a test instrument using any of the probe accessories shown in FIGS. 5-7.
Figure 13:
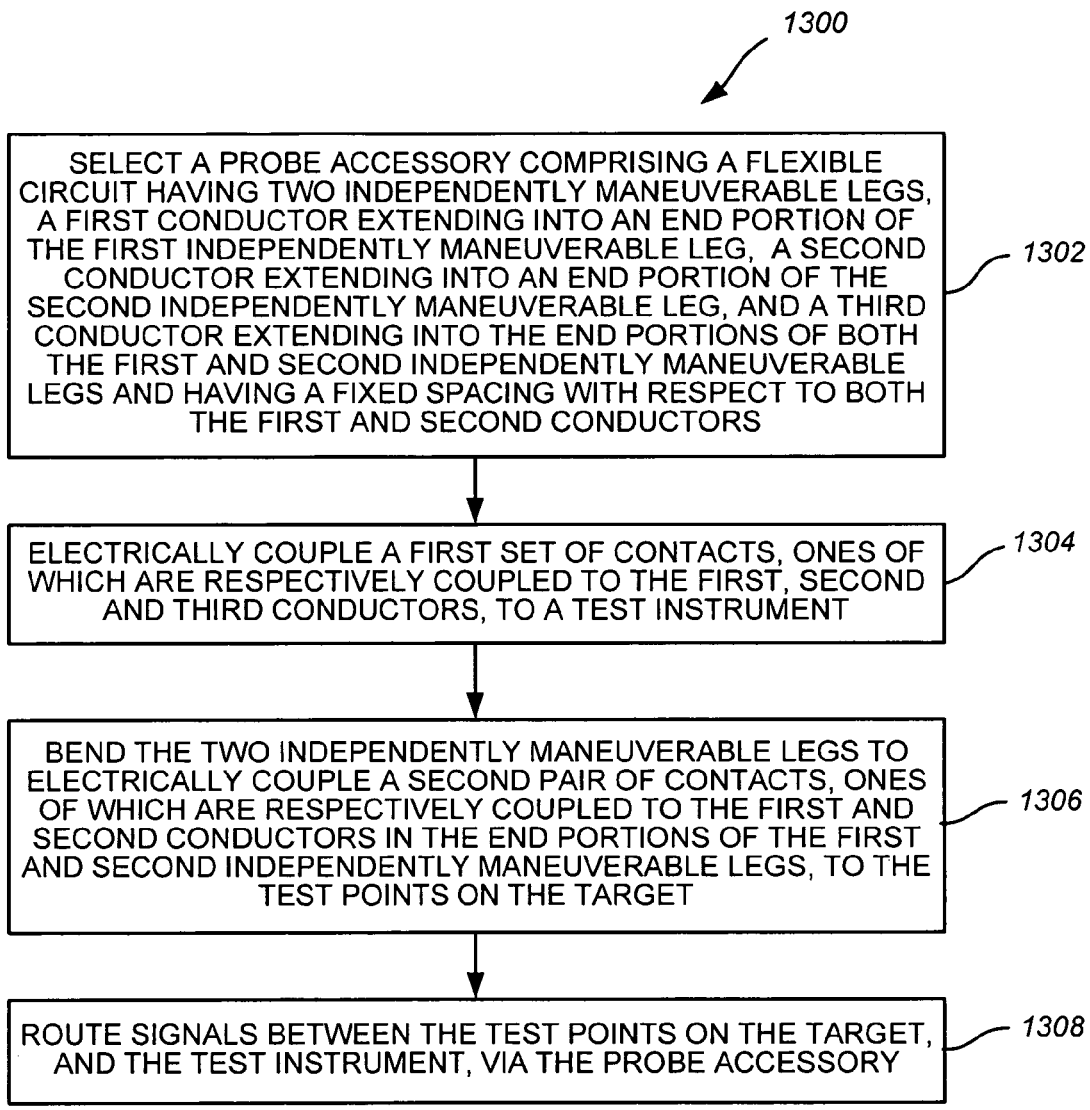
FIG. 13 illustrates an exemplary method for routing signals between test points on a target and a test instrument using the probe accessory shown in FIG. 10.

FIGS. 11-13 illustrate various methods 1200, 1300 and apparatus 1100 for routing signals between test points 1142 on a target 1140, and a test instrument 1144.

Method 1200 (FIG. 12) comprises selecting a probe accessory 1100 (FIG. 11) comprising a flexible circuit having two independently maneuverable legs 1104, 1106, a first conductor extending into an end portion 1108 of the first independently maneuverable leg 1104, and a second conductor extending into end portions 1108, 1110 of both the first and second independently maneuverable legs 1104, 1106 and having a fixed spacing with respect to the first conductor. See step 1202. In some cases, one of the probe accessories 500, 600, 800 shown in FIG. 5, 6 or 8 may be selected.

The method 1200 proceeds with the electrical coupling of a first pair of contacts 1122, 1124, respectively coupled to the first and second conductors of the probe accessory 1100, to a test instrument 1144. See step 1204. The two independently maneuverable legs 1104, 1106 are then bent to electrically couple a second pair of contacts 1126, 1128, respectively coupled to the first and second conductors of the probe accessory 1100, to selected test points 1142 on a target 1140. See step 1206. Electrical signals may then be routed between the test points 1142 on the target 1140 and the test instrument 1144 (e.g., via the cable 1146). See step 1208.

In the case of differential probing, method 1300 (FIG. 13) comprises selecting a probe accessory 1100 (FIG. 11) comprising a flexible circuit having two independently maneuverable legs 1104, 1106, a first conductor extending into an end portion 1108 of the first independently maneuverable leg 1104, a second conductor extending into an end portion 1110 of the second independently maneuverable leg 1106, and a third conductor extending into the end portions 1108, 1110 of both the first and second independently maneuverable legs 1104, 1106 and having a fixed spacing with respect to both the first and second conductors. See step 1302. In some cases, the probe accessory 1000 shown in FIG. 10 may be selected.

The method 1300 proceeds with the electrical coupling of a first set of contacts 1122, 1124, respectively coupled to the first and second conductors of the probe accessory 1100, to a test instrument 1144. See step 1304. The two independently maneuverable legs 1104, 1106 are then bent to electrically couple a second pair of contacts 1126, 1128, respectively coupled to the first and second conductors of the probe accessory 1100, to selected test points 1142 on a target 1140. See step 1306. Electrical signals may then be routed between the test points 1142 on the target 1140 and the test instrument 1144 (e.g., via the cable 1146). See step 1308.

What is claimed is:

1. A probe accessory for electrically coupling a target to a test instrument, comprising:
    a flexible circuit having, first and second regions, each having an end portion that terminates at a common edge of the flexible circuit;
    a first conductor extending into the end portion of the first region;
    a second conductor extending into the end portions of the first and second, regions, the second conductor having a fixed spacing with respect to the first conductor; and
    a separation feature extending between the first and second regions from said common edge, the separation feature aiding creation of two independently maneuverable legs of the flexible circuit, each leg comprising a respective end portion of one of the first and second regions, while maintaining the fixed spacing between the first and second conductors;
    a first pair of contacts, ones of which are respectively coupled to the first and second conductors, for electrically coupling the first and second conductors to the test instrument; and
    a second pair of contacts, ones of which are respectively coupled to the first and second conductors in the end portions of the first and second regions, for electrically coupling the first and second conductors to the target.

2. A probe accessory for electrically coupling a target to a test instrument, comprising:
    a flexible circuit having,
        first and second independently maneuverable legs, each terminating in an end portion;
        a first conductor extending into the end portion of the first independently maneuverable leg; and
        a second conductor extending into the end portions of both the first and second independently maneuverable legs and having a fixed spacing with respect to the first conductor;
    a first pair of contacts, ones of which are respectively coupled to the first and second conductors, for electrically coupling the first and second conductors to the test instrument; and
    a second pair contacts, ones of which are respectively coupled to the first and second conductors in the end portions of the first and second independently maneuverable legs, for electrically coupling the first and second conductors to the target.

3. The probe accessory of claim 2, wherein the independently maneuverable legs extend in the same direction.

4. The probe accessory of claim 2, wherein the independently maneuverable legs extend in opposite directions.

5. The probe accessory of claim 2, further comprising a damping resistor, coupled in series with the first conductor in the end portion of the first independently maneuverable leg.

6. The probe accessory of claim 2, wherein the first and second conductors are formed on a common layer of the flexible circuit.

7. The probe accessory of claim 2, wherein the first and second conductors are formed on different layers of the flexible circuit.

8. The probe accessory of claim 2, further comprising a separation feature, positioned between the first and second independently maneuverable legs to aid further separation of the two independently maneuverable legs while maintaining the fixed spacing between the first and second conductors.

9. The probe accessory of claim 8, wherein the separation feature aids in dividing the probe accessory into a first probe accessory comprising the first independently maneuverable leg, and a second probe accessory comprising the second independently maneuverable leg.

10. The probe accessory of claim 8, wherein the separation feature comprises a printed cut-line.

11. The probe accessory of claim 8, wherein the separation feature comprises perforations.

12. The probe accessory of claim 8, wherein the separation feature comprises a notch in the flexible circuit.

13. The probe accessory of claim 8, wherein the separation feature comprises a detent in the flexible circuit.

14. The probe accessory of claim 2, wherein the first pair of contacts comprise pins.

15. The probe accessory of claim 2, wherein the second pair of contacts comprise receptacles.

16. A probe accessory for electrically coupling a target to a test instrument, comprising:
- a flexible circuit having, first and second regions, each having an end portion that terminates at a common edge of the flexible circuit;
- a first conductor extending into the end portion of the first region:
- a second conductor extending into the end portion of the second region;
- a third conductor extending into the end portions of both the first and second regions and having a fixed spacing with respect to the first and second conductors; and
- a separation feature extending between the first and second regions from said common edge, the separation feature aiding creation of two independently maneuverable legs of the flexible circuit, each leg comprising a respective end portion of one of the first and second regions, while maintaining the fixed spacing between the first and third conductors;
- a set of contacts, ones of which are respectively coupled to the first, second and third conductors, for electrically coupling the first, second and third conductors to the test instrument; and
- a pair of contacts, ones of which are respectively coupled to the first and second conductors in the end portions of the first and second regions, for electrically coupling the first and second conductors to the target.

17. A probe accessory for electrically coupling a target to a test instrument, comprising:
- a flexible circuit having, first and second independently maneuverable legs, each terminating in an end portion;
- a first conductor extending into the end portion of the first independently maneuverable leg;
- a second conductor extending into the end portion of the second independently maneuverable leg; and
- a third conductor extending into the end portions of both the first and second independently maneuverable legs and having a fixed spacing with respect to both the first and second conductors;
- a set of contacts, ones of which are respectively coupled to the first, second and third conductors, for electrically coupling the first, second and third conductors to the test instrument;
- a pair of contacts, ones of which are respectively coupled to the first and second conductors in the end portions of the first and second independently maneuverable legs, for electrically coupling the first and second conductors to the target.

18. The probe accessory of claim 17, further comprising a pair of damping resistors, respectively coupled in series with the first and second conductors in the end portions of the first and second independently maneuverable legs.

19. The probe accessory of claim 17, further comprising a separation feature, positioned between the first and second independently maneuverable legs to aid further separation of the two independently maneuverable legs while maintaining the fixed spacing between the third conductor and the first and second conductors.

* * * * *